United States Patent
Kerstetter et al.

(10) Patent No.: US 12,112,831 B2
(45) Date of Patent: Oct. 8, 2024

(54) MEMORY ROW-HAMMER MITIGATION

(71) Applicant: Micron Technology, Inc., Boise, ID (US)

(72) Inventors: Bryan David Kerstetter, Kuna, ID (US); Alan J. Wilson, Boise, ID (US); Donald Martin Morgan, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 17/877,592

(22) Filed: Jul. 29, 2022

(65) Prior Publication Data

US 2024/0038284 A1    Feb. 1, 2024

(51) Int. Cl.
*G11C 8/20* (2006.01)
*G11C 7/10* (2006.01)
*G11C 7/24* (2006.01)

(52) U.S. Cl.
CPC .............. *G11C 7/24* (2013.01); *G11C 7/1063* (2013.01); *G11C 7/1066* (2013.01); *G11C 8/20* (2013.01)

(58) Field of Classification Search
CPC ....... G11C 7/24; G11C 7/1063; G11C 7/1066; G11C 8/20; G11C 7/22; G11C 11/2295; G11C 16/22; G11C 16/30; G11C 16/32; G11C 16/3418; G11C 7/02
See application file for complete search history.

(56) References Cited

U.S. PATENT DOCUMENTS

2016/0314826 A1* 10/2016 Augustine ........... G11C 11/1657
2020/0081631 A1*  3/2020 Schaefer ............... G06F 3/0629
2020/0341847 A1* 10/2020 Boehm .................. G11C 29/52

* cited by examiner

*Primary Examiner* — Jay W. Radke
(74) *Attorney, Agent, or Firm* — Holland & Hart LLP

(57) ABSTRACT

Methods, systems, and devices for memory row-hammer mitigation are described. A memory device may operate based on a scheme that is continuous across power cycles. For example, the memory device may access a region if a value of a counter does not satisfy a threshold value and may access the region if a value of the counter satisfies the threshold value. Upon transitioning power states, the value of the counter may be stored to a non-volatile memory such that it may be accessed when transitioning back to the original power state (e.g., an "ON" state). Accordingly, the value of the counter may be maintained across power cycles.

25 Claims, 9 Drawing Sheets

MEMORY ROW-HAMMER MITIGATION

FIELD OF TECHNOLOGY

The following relates to one or more systems for memory, including memory row-hammer mitigation.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. Non-volatile devices may have lower densities than volatile memory devices due to larger memory cells. However, non-volatile memory devices may be able to achieve densities similar to volatile memory by decreasing the memory cell size.

DETAILED DESCRIPTION

Figure 1:
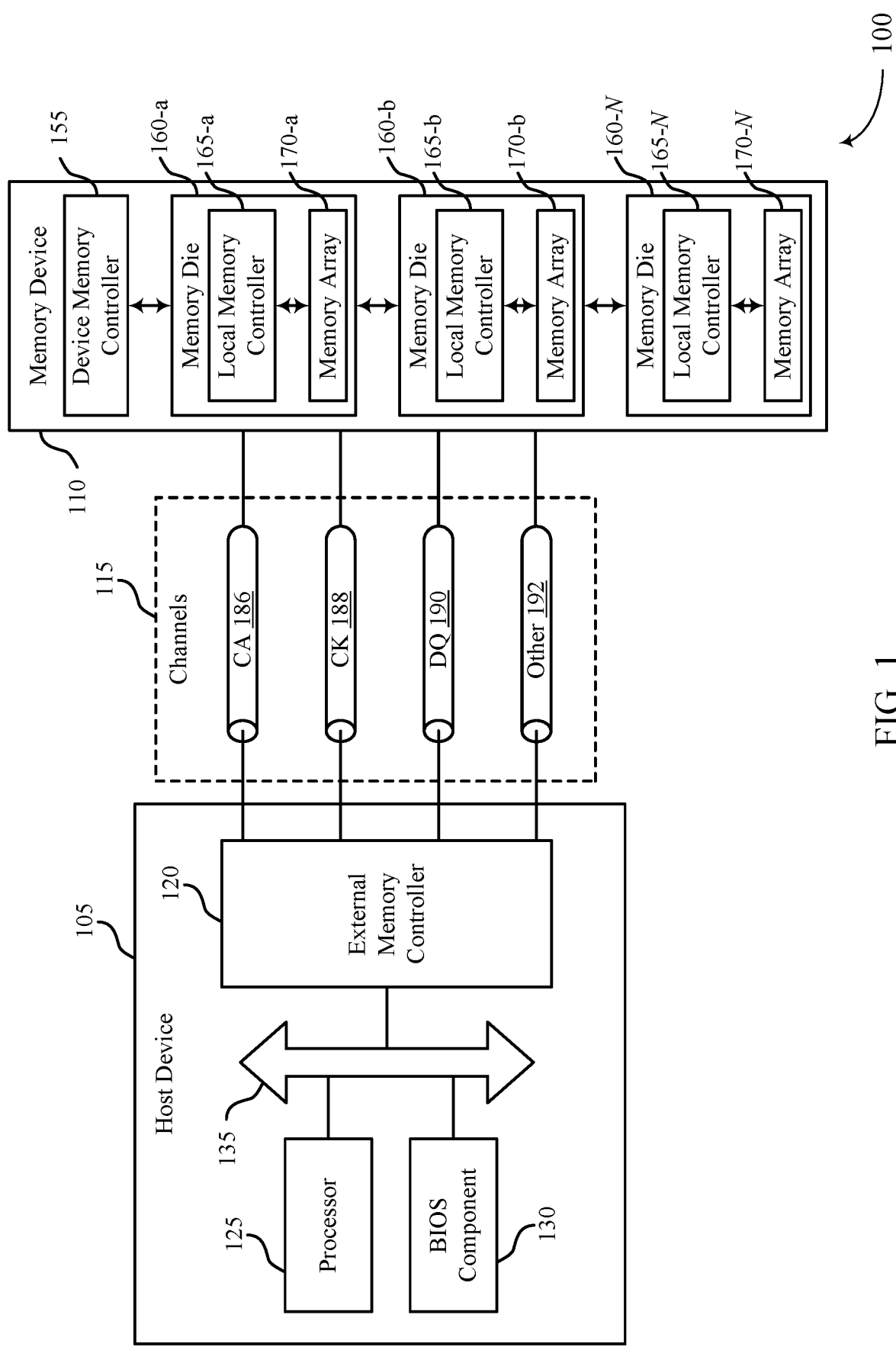
FIG. 1 illustrates an example of a system that supports memory row-hammer mitigation in accordance with examples as disclosed herein.

In some examples, memory cells (e.g., non-volatile memory cells) included in a memory system may support a finite quantity of access operations (e.g., read operations, write operations) as repeated access operations may cause the memory cells to degrade or otherwise wear out over time. In such examples, excess wear may lead to charge leakage and poor data retention rates, among other defects, in the memory cells. To reduce wear, some memory systems may employ schemes (e.g., wear-leveling mitigation schemes) to perform or refrain from performing access operations on regions (e.g., blocks of memory cells) based on various conditions associated with the regions.

However, such schemes may not prevent repeated access operations on particular memory cells across power cycles of the memory system, which may be exploitable by a malicious actor or other security risk. For example, a memory system (e.g., a non-volatile memory system) may employ a counter associated with a quantity of access operations to a region of the memory system, and the memory system may perform or refrain from performing access operations at the region based on a value of the counter. In such examples, the value of the counter may be reset during a power transition, which may allow for a malicious actor to concentrate a relatively large quantity of access operations on target rows within a region across power cycles. By performing such large quantities of access operations on a single row (or multiple rows of a subset) of a memory system, a malicious actor may cause the target rows to wear out more quickly and fail, among other issues.

In accordance with examples as disclosed herein, a memory system may utilize a scheme to mitigate row hammering across power cycles (e.g., across multiple power cycles). For example, a memory system may perform or refrain from performing access operations in accordance with a counter that tracks a quantity of access operations performed on a region of the memory system, where a value of the counter will be maintained across power cycles. During operation, a memory system may receive a command (e.g., from a host system) to access a particular region of the memory system. The memory system may perform a corresponding access operation if the value of the counter associated with the region is less than (e.g., or in some cases equal to) a threshold, and may not perform the access operation (e.g., may refrain from performing the access operation) if the counter value satisfies the threshold (e.g., is greater than the threshold, or in some cases is equal to the threshold). After performing an access operation, the memory system may adjust (e.g., increment) the counter value.

In some examples, the memory system may perform a memory management operation (e.g., a refresh operation, a wear-leveling operation, another similar operation) on the region (e.g., in accordance with a memory management command). After performing the management operation, the memory system may adjust (e.g., decrement) the counter. The memory system may perform such management operations based on a predefined or preconfigured frequency (e.g., within a quantity of accesses to the region) associated with (e.g., as tracked by) the counter. In some cases, the memory system may receive a command to transition power states (e.g., power off) from the host device. Before transitioning power states, the memory system may store a value of the counter to a non-volatile memory (e.g., a dedicated non-volatile register), and may retrieve (e.g., read) the counter value after transitioning power states for a second time (e.g., after powering back on). Accordingly, the memory system may maintain the value of the counter across power cycles, and may perform memory management operations within a defined frequency to mitigate the effects of repeated accesses to the region as an access count is maintained across power cycles. In general, utilizing such a scheme to mitigate row hammering across power cycles, the memory system will have a prolonged useful life and improved overall performance, among other benefits.

Although the techniques are described herein with reference to one or more types of memory, the same techniques may apply to one or more other types of memory without departing from the scope of the present disclosure. For example, the techniques described herein may apply to any type of memory (e.g., dynamic random access memory (DRAM), not- and memory (NAND)) to which one or more commands described herein apply (e.g., memory management commands, access commands, commands to transition between power states).

Figure 2:
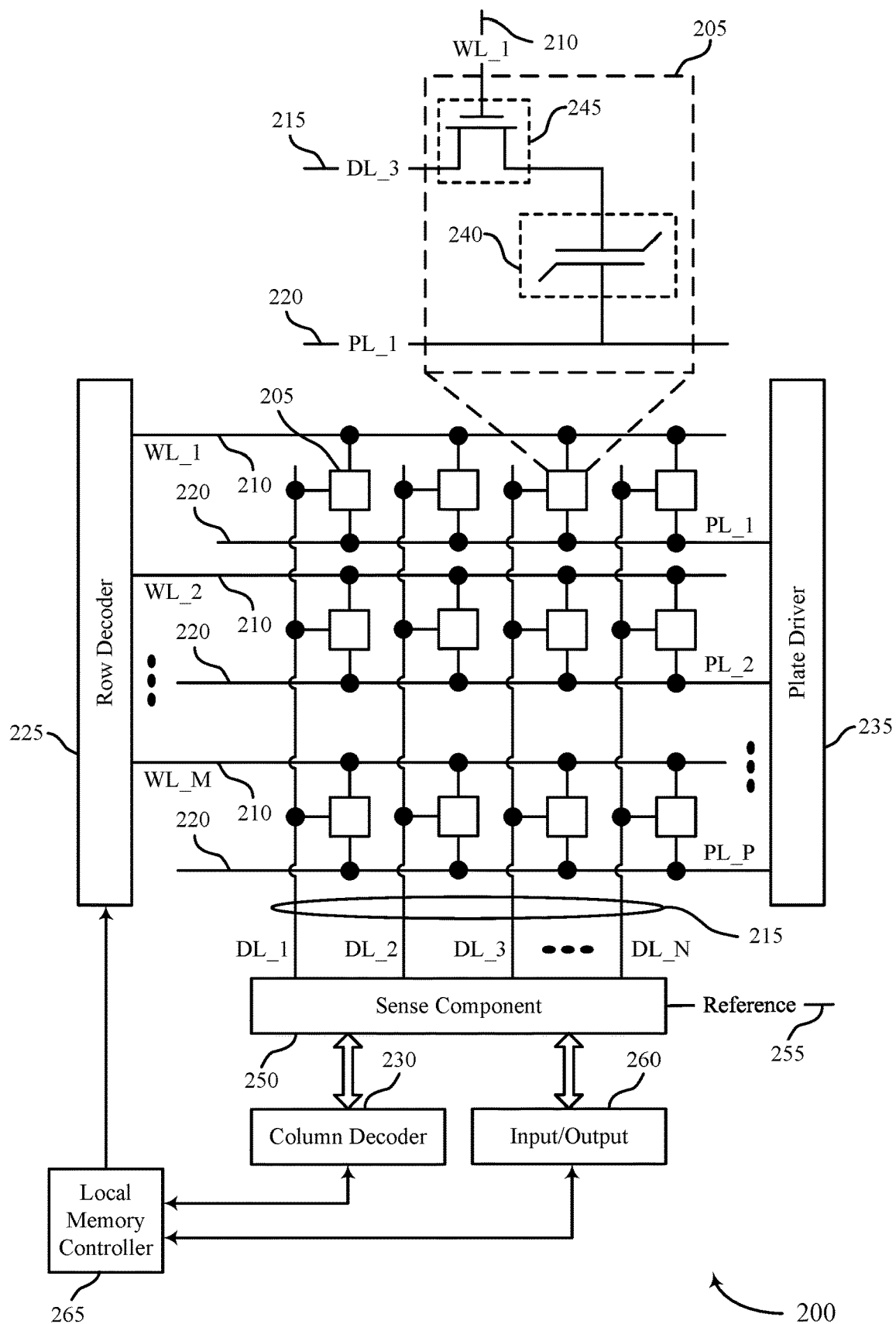
FIG. 2 illustrates an example of a memory die that supports memory row-hammer mitigation in accordance with examples as disclosed herein.

Features of the disclosure are initially described in the context of systems and dies with reference to FIGS. 1 and 2. Features of the disclosure are described in the context a system and process flow diagrams with reference to FIGS. 3 through 5. These and other features of the disclosure are further illustrated by and described with reference to an apparatus diagram and flowcharts that relate to memory row-hammer mitigation as described with reference to FIGS. 6 through 9.

FIG. 1 illustrates an example of a system 100 that supports memory row-hammer mitigation in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, memory cells (e.g., non-volatile memory cells) included in a memory device 110 may support a finite quantity of accesses (e.g., read operations, write operations) as repeated accesses may cause wear on the memory cells. In such examples, sufficient wear may lead to charge leakage and poor retention rates, among other defects, in the effected memory cells. To reduce wear, a memory device 110 may employ a scheme to perform or refrain from performing access operations on regions (e.g., blocks of memory cells) based on various conditions associated with the regions.

In accordance with examples as disclosed herein, a memory device 110 may utilize a scheme to mitigate row hammering across power cycles. For example, a memory device 110 may perform or refrain from performing access operations in accordance with a counter which tracks a quantity of access operations performed on a region of the memory device 110, where a value of the counter may be maintained across power cycles. During operation, the memory device 110 may receive a command (e.g., from a host device 105) to access a particular region or die 160 of the memory device 110. The memory device 110 (e.g., the device memory controller 155) may perform a corresponding access operation if the value of the counter associated with the region is less than a threshold, and may not perform the access operation (e.g., may refrain from performing the access operation) if the counter value satisfies the threshold. After performing an access operation, the memory device 110 may increment the counter value.

In some examples, the memory device 110 may perform a memory management operation (e.g., a refresh operation, a wear-leveling operation, another similar operation) on the region (e.g., in accordance with a memory management command). After performing the management operation, the memory device 110 may adjust (e.g., decrement) the counter. The memory device 110 may perform such management operations based on a predefined or preconfigured frequency (e.g., within a quantity of accesses to the region) associated with (e.g., as tracked by) the counter. In some cases, the memory device 110 may receive a command to transition power states (e.g., power off) from the host device 105. Before transitioning power states, the memory device (e.g., the device memory controller 155) may store a value of the counter to a non-volatile memory (e.g., a dedicated non-volatile register), and may retrieve (e.g., read) the counter value after transitioning power states for a second time (e.g., after powering back on). Accordingly, the memory device 110 may maintain the value of the counter across power cycles, and may perform memory management operations within a defined frequency to mitigate the effects of repeated accesses to the region as an access count is maintained across power cycles. In general, utilizing such a scheme to mitigate row hammering across power cycles, the memory device 110 will have a prolonged useful life and improved overall performance, among other benefits.

FIG. 2 illustrates an example of a memory die 200 that supports memory row-hammer mitigation in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., a polarization state, a dielectric charge) representative of the programmable states in a capacitor. The memory cell 205 may include a logic storage component, such as capacitor 240, and a switching component 245 (e.g., a cell selection component). A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. The memory cell 205 may include a capacitor 240 to store a charge or polarization representative of the programmable state.

The memory die 200 may include access lines (e.g., word lines 210, digit lines 215, plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding. Memory cells 205 may be positioned at intersections of the word lines 210, the digit lines 215, or the plate lines 220.

Operations such as reading and writing may be performed on memory cells 205 by activating access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. The intersection of a word line 210 and a digit line 215 in a two-dimensional or in a three-dimensional configuration may be referred to as an address of a memory cell 205. Activating a word line 210, a digit line 215, or a plate line 220 may include applying a voltage to the respective line.

Accessing the memory cells 205 may be controlled through a row decoder 225, a column decoder 230, or a plate driver 235, or any combination thereof. For example, a row decoder 225 may receive a row address from the local memory controller 265 and activate a word line 210 based on the received row address. A column decoder 230 may receive a column address from the local memory controller 265 and activate a digit line 215 based on the received column address. A plate driver 235 may receive a plate address from the local memory controller 265 and activate a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state, a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage, a reference line). The detected logic state of the memory cell 205 may be provided as an output of the sense component 250 (e.g., to an input/output 260), and may indicate the detected logic state to another component of a memory device (e.g., a memory device 110) that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 265 may identify a target memory cell 205 on which to perform the write operation. The local memory controller 265 may identify a target word line 210 and a target digit line 215 coupled with the target memory cell 205 (e.g., an address of the target memory cell 205). The local memory controller 265 may activate the target word line 210 and the target digit line 215 (e.g., applying a voltage to the word line 210 or digit line 215) to access the target memory cell 205. The local memory controller 265 may apply a signal (e.g., a write pulse, a write voltage) to the digit line 215 during the write operation to store a specific state (e.g., charge) in the capacitor 240 of the memory cell 205. The signal used as part of the write operation may include one or more voltage levels over a duration.

The local memory controller 265 may be operable to perform a read operation (e.g., a sense operation) on one or more memory cells 205 of the memory die 200. During a read operation, the state (e.g., logic state, charge state, polarization state) stored in a memory cell 205 of the memory die 200 may be evaluated (e.g., read, determined, identified). The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal (e.g., charge, voltage) to the sense component 250 in response to biasing the access lines. The sense component 250 may amplify the signal. The local memory controller 265 may activate the sense component 250 (e.g., latch the sense component) and compare the signal received from the memory cell 205 to a reference (e.g., the reference 255). Based on that comparison, the sense component 250 may determine a logic state that is stored on the memory cell 205.

In some examples, memory cells 205 (e.g., non-volatile memory cells 205) included in a memory die 200 may support a finite quantity of accesses (e.g., read operations, write operations) as repeated accesses may cause wear on the memory cells 205. In such examples, sufficient wear may lead to charge leakage and poor retention rates, among other defects, in the effected memory cells 205. To reduce wear, a memory die 200 may employ a scheme to perform or refrain from performing access operations on regions (e.g., blocks of memory cells 205) based on various conditions associated with the regions.

In accordance with examples as disclosed herein, a memory die 200 may utilize a scheme to mitigate row hammering across power cycles. For example, a memory die 200 may perform or refrain from performing access operations in accordance with a counter which tracks a quantity of access operations performed on a region of the memory die 200, where a value of the counter may be maintained across power cycles. During operation, the memory die 200 may receive a command (e.g., from a host device 105 as described with reference to FIG. 1) to access a particular region or array of the memory die 200. The memory die 200 (e.g., the local memory controller 265) may perform a corresponding access operation if the value of the counter associated with the region is less than a threshold, and may not perform the access operation (e.g., may refrain from performing the access operation) if the counter value satisfies the threshold. After performing an access operation, the memory die 200 may increment the counter value.

In some examples, the memory die 200 may perform a memory management operation (e.g., a refresh operation, a wear-leveling operation, another similar operation) on the region (e.g., in accordance with a memory management command). After performing the management operation, the memory die 200 may adjust (e.g., decrement) the counter. The memory die 200 may perform such management operations based on a predefined or preconfigured frequency (e.g., within a quantity of accesses to the region) associated with (e.g., as tracked by) the counter. In some cases, the memory die 200 may receive a command to transition power states (e.g., power off) from the host device 105. Before transitioning power states, the memory device (e.g., the local memory controller 265) may store a value of the counter to a non-volatile memory (e.g., a dedicated non-volatile register), and may retrieve (e.g., read) the counter value after transitioning power states for a second time (e.g., after powering back on). Accordingly, the memory die 200 may maintain the value of the counter across power cycles, and may perform memory management operations within a defined frequency to mitigate the effects of repeated accesses to the region as an access count is maintained across power cycles. In general, utilizing such a scheme to mitigate row hammering across power cycles, the memory die 200 will have a prolonged useful life and improved overall performance, among other benefits.

Figure 3:
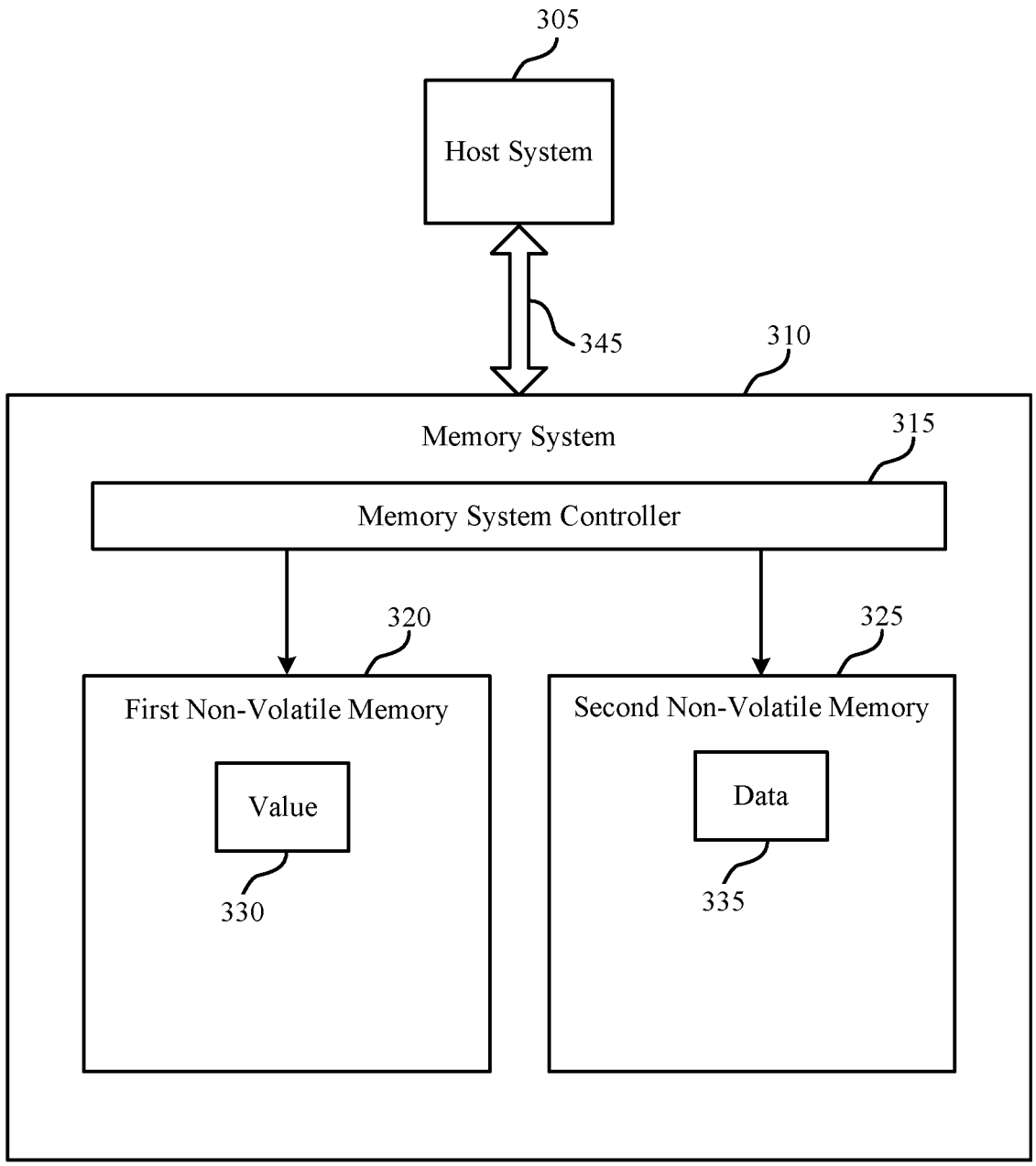
FIG. 3 illustrates an example of a system that supports memory row-hammer mitigation in accordance with examples as disclosed herein.

FIG. 3 illustrates an example of a system 300 that supports memory row-hammer mitigation in accordance with examples as disclosed herein. The system 300 may be an example of the system 100 as described with reference to FIG. 1, and may include a host system 305 and a memory system 310. In some examples, the host system 305 may be coupled with the memory system 310 via an interface 345. The memory system 310 may include a memory system controller 315, a first non-volatile memory 320, and a second non-volatile memory 325. The memory system 310 may be configured to perform access operations on the second non-volatile memory 325, where the memory system 310 may access or refrain from accessing the second non-volatile memory 325 based on a counter (e.g., based on a value of a counter).

By implementing a counter, the memory system 310 may mitigate the effects caused by repeated access operations performed on a same row of the second non-volatile memory 325 (e.g., based on one or more row-hammering events). The memory system 310 may store a value of the counter to non-volatile memory before a power transition to reduce the likelihood of row-hammering across power cycles. By utilizing such a scheme that is continuous across power cycles, the memory system 310 may have a prolonged useful life and improved overall performance.

In some cases, the second non-volatile memory 325 may be an example of an array of ferroelectric memory cells or one or more NAND blocks (e.g., one or more blocks of NAND memory cells) configured to store data 335 (e.g., data received from a host system 305). The first non-volatile memory 320 may be an example of a register (e.g., a dedicated register) that includes one or more non-volatile memory cells. Alternatively, the memory system 310 may include a single non-volatile memory, where, in such instances, the first non-volatile memory 320 may be a subset (e.g., a dedicated array, a dedicated bank) of the second non-volatile memory 325. In some examples, a region (e.g., one or more blocks of non-volatile memory cells, a monitoring area) of the second non-volatile memory 325 may be accessed (e.g., by the memory system controller 315) in accordance with a value 330 of a counter stored to the first non-volatile memory 320 (e.g., an access count, a rolling accumulated activate (RAA) count), where the second non-volatile memory 325 may support a finite quantity of accesses (e.g., before a refresh operation) as tracked by the counter. Additionally, or alternatively, the memory system 310 may be configured to store the value 330 of the counter in the first non-volatile memory 320 before the memory system 310 transitioning power states. By storing the value 330 of the counter before a power transition, the memory system 310 may prevent or mitigate the occurrence of row-hammering events.

The memory system controller 315 may perform various operations associated with the memory system 310. For example, the memory system controller 315 may receive access commands (e.g., read commands, write commands), read data 335 and write data 335 to the second non-volatile memory 325, monitor a quantity of access operations performed on one or more regions of the second non-volatile memory 325, and initiate memory management operations (e.g., refresh operations) performed on one or more regions of the second non-volatile memory 325. In some examples, the memory system controller 315 may be coupled with the first non-volatile memory 320 and the second non-volatile memory 325. In such examples, the memory system controller 315 may be operable to perform access and refresh operations to the second non-volatile memory 325 in accordance with the value 330 of the counter, and may be further operable to write the value 330 of the counter to and read the value 330 of the counter from the first non-volatile memory 320 based on identifying one or more conditions (e.g., based on a power transition, based on identifying a triggering event).

In some examples, the memory system controller 315 may include or monitor (e.g., maintain) a counter corresponding to a region of the second non-volatile memory 325, where the value 330 of the counter indicates a quantity of access operations performed on the respective region of the second non-volatile memory 325. As described herein, a region may be an example of a row or array of ferroelectric memory cells or a block of NAND memory cells, among other possibilities. Additionally or alternatively, the memory system controller 315 may maintain multiple counters and each counter may correspond to a respective region of the second non-volatile memory 325.

The memory system controller 315 may access (e.g., read) the value 330 of the counter in the first non-volatile memory 320 (e.g., after a power transition) and, in some cases, maintain the value 330 of the counter at the first non-volatile memory 320 or second non-volatile memory 325 (e.g., during the current power cycle). In such cases, the memory system controller 315 may be configured to write or otherwise update the value 330 of the counter in the first non-volatile memory 320 based on identifying one or more conditions. For example, the memory system controller 315 may write the value 330 of the counter to the first non-volatile memory 320 based on receiving a command from the host system 305 to transition from a first power state (e.g., an 'ON' state) to a second power state (e.g., an 'OFF' state, a low power state, a hibernate state).

Moreover, following a subsequent transition from the second power state to the first power state, the memory system controller 315 may read the value 330 of the counter (e.g., based on identifying the subsequent transition, based on receiving an access command). By storing the value 330 before transitioning to the second power state and retrieving the value 330 of the counter after transitioning to the first power state, the memory system 310 may maintain the value 330 of the counter across power cycles.

In some examples, the memory system 310 may receive a command to access a region of the second non-volatile memory 325 from the host system 305. In response to receiving the access command, the memory system controller 315 may read the value 330 of the counter (e.g., from the first non-volatile memory 320) and determine whether the value 330 of the counter satisfies (e.g., is equal to, exceeds) a threshold value. As described herein, each region of the second non-volatile memory 325 may be associated with a respective threshold value, thus the memory system controller 315 may determine whether the value 330 of the counter for the region satisfies the respective threshold value (e.g., where the threshold value is a threshold quantity of access operations).

If the value 330 of the counter satisfies the threshold, the memory system controller 315 may refrain from performing an access operation on the region of the second non-volatile memory 325, and thus may not update the counter. Accordingly, the memory system controller 315 may ignore the access command because the region of the second non-volatile memory 325 may have been accessed a relatively large quantity of times (e.g., before a refresh operation). By refraining from the performing the access operation, the memory system controller 315 may reduce the amount of wear (e.g., associated with repeated access operations) to the region of the non-volatile memory 325. If the value 330 of the count does not satisfy the threshold, the memory system controller 315 may perform the access operation on the region of the second non-volatile memory 325 and may update the counter accordingly (e.g., update the counter for each access operation performed on the region of the second non-volatile memory 325).

In some examples, the memory system 310 may receive a memory management command (e.g., a command to perform a refresh operation, a command to trigger a wear-leveling operation, or another similar command) from the host system 305 that is associated with a region of the non-volatile memory 325. In response to receiving the memory management command, the memory system controller 315 may perform a memory management operation (e.g., a refresh operation, a wear-leveling operation, or another similar operation) on the associated region of the second non-volatile memory 325.

In some cases, after performing the memory management operation, the memory system controller 315 may decrement the counter. For example, the memory system controller 315 may decrement the counter by a preconfigured quantity or a quantity specified by the host system 305 (e.g., in accordance with an RAA decrement (RAADEC) per memory management command). Additionally or alternatively, the memory system controller 315 may reset the counter. In some cases, the memory system controller 315 may perform one or more memory management operations on the region of the second non-volatile memory 325 at a predetermined or predefined frequency (e.g., within a quantity of access cycles) as tracked by the counter and, in some examples, the memory system controller 315 may postpone the one or more memory management operations. By performing a memory management operation on the region of the second non-volatile memory 325 (e.g., in accordance with a memory management command), the memory system controller 315 may reduce the effects of wear (e.g., due to repeated activations) on memory cells contained therein.

In some examples, the memory system 310 may receive a command from the host system 305 to transition from the first power state to the second power state. In such examples, during the power transition and before switching to the second power state, the memory system controller 315 may store (or otherwise update) the value 330 of the counter stored to the first non-volatile memory 320. By storing the value 330 of the counter, the memory system 310 may load (e.g., read) the value 330 of the counter during a subsequent power cycle transition (e.g., in accordance with transitioning to the first power state). For instance, the memory system 310 may transition from the second power state to the first power state, and may then receive an access command associated with the region of the second non-volatile memory 325. In response to receiving the access command, the memory system controller 315 may read the value 330 of the counter from the first non-volatile memory 320, where the value 330 of the counter may be a same value as before powering down during the last power transition, and the memory system controller 315 may perform or refrain from performing an access operation to the region of the second non-volatile memory 325 based on a comparison between the value 330 of the counter and the threshold.

In such examples, the memory system 310 may maintain continuity of the value 330 of the counter across power cycles (e.g., across one or more power transitions), and, as such, the useful life of the memory system 310 may be prolonged. For example, by maintaining the value 330 of the counter across power cycles, the memory system 310 may reduce repeated accesses to one or more rows of the second non-volatile memory 325 due to a malicious actor or other security risk.

Figure 4:
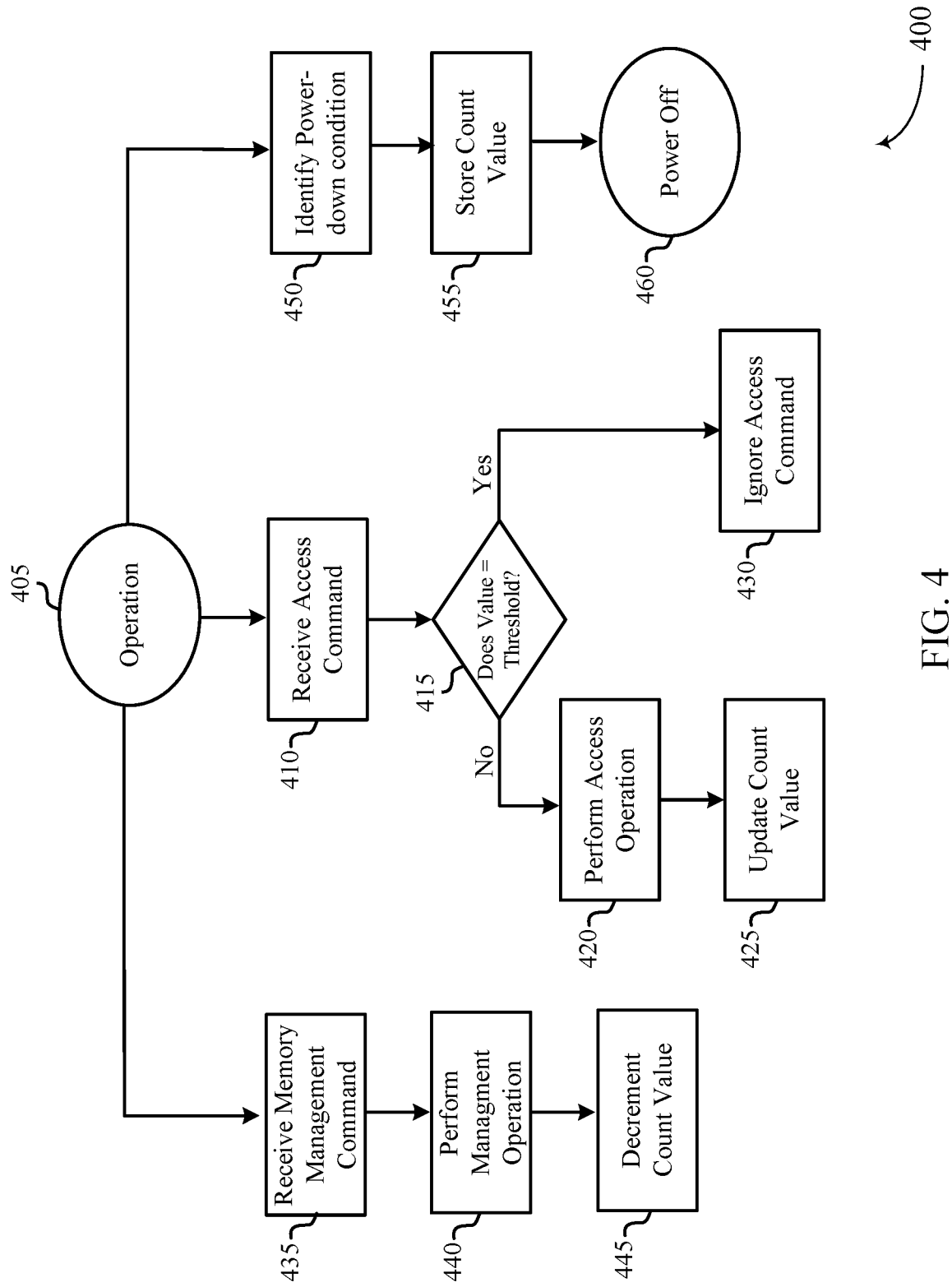
FIG. 4 illustrates an example of a process flow diagram that supports memory row-hammer mitigation in accordance with examples as disclosed herein.

FIG. 4 illustrates an example of a process flow diagram 400 that supports memory row-hammer mitigation in accordance with examples as disclosed herein. Aspects of the process flow diagram 400 may be implemented by a memory system described with reference to FIGS. 1 through 3. The memory system may be an example of the memory system 310 as described with reference to FIG. 3, and may include a first non-volatile memory and a second non-volatile memory. The process flow diagram 400 may depict a process for implementing a scheme to mitigate row hammering that is continuous across power cycles, where process flow diagram 400 may illustrate the operation of a memory system before transitioning power states. By utilizing such a scheme that is continuous across power cycles, the memory system may have a prolonged useful life and improved overall performance.

In some cases, one or more aspects of the process flow diagram 400 may be implemented by a controller (e.g., among other components), of the memory system. Additionally or alternatively, aspects of the process flow diagram 400 may be implemented as instructions stored in the memory system, or by circuitry of the memory system. For example, the instructions, if executed by a controller, may cause the memory system to perform one or more of the operations of the process flow diagram 400. Alternative examples of the process flow diagram 400 may be implemented in which some operations are performed in a different order than described, or not performed at all. In some cases, operations may include features not mentioned below, or additional operations may be added.

At 405, the memory system may perform one or more operations, and may be referred to as being in a standby or idle state with respect to receiving commands (e.g., access commands, memory management commands) from a host system. In such examples, the memory system may operate in the standby or idle state until the memory system receives a command from the host system.

At 405, the memory system may be available to perform one or more operations, and may be referred to as being in a standby or idle state with respect to receiving commands (e.g., access commands, memory management commands) from a host system. In such examples, the memory system may operate in the standby or idle state until the memory system receives a command from the host system.

At 415, the memory system may determine if a value of a counter (e.g., a RAA count) for the region satisfies a threshold value. The threshold may be an example of an RAA maximum management threshold (RAAMMT), where the RAAMMT may define a quantity of accesses the region of the second non-volatile memory may support. For example, the memory system may read the value of the counter from either the first non-volatile memory, the second non-volatile memory, or from various other locations of the memory system, and may determine if the counter value satisfies the threshold value.

At 420, if the value of the counter does not satisfy the threshold value (e.g., if the value is less than the threshold value), the memory system may perform an access operation on the region of the second non-volatile memory. For example, the memory system may access (e.g., read data from, write data to) the region of the second non-volatile memory in accordance with the access command received at 410.

At 425, in response to performing the access operation, the memory system may update (e.g., increment, increase) the counter. The memory system may update the counter for each access operation performed on the region. After updating the counter, the memory system may return to a standby or idle state.

At 430, if the value of the counter satisfies (e.g., is greater than or equal to) the threshold value, the memory system may refrain from processing the access command (e.g., refrain from performing the associated access operation). For example, the memory system may refrain from accessing the region of the second non-volatile memory, and thus may not update the counter. In some examples, the memory system may communicate one or more indications to the host system that the access operation was not performed. After refraining from performing the access command, the memory system may return to standby or idle state.

At 435, the memory system may receive a command (e.g., a memory management command) from the host system to perform a memory management operation on the region of the second non-volatile memory. At 440, in response to receiving the memory management command, the memory system may perform one or more memory management operations on the region of the second non-volatile memory. For example, the memory system may perform a refresh operation, a wear-leveling operation, or another similar operation on the region. By performing such an operation, the memory system may reduce the effects caused by the repeated access operations without a memory management operation being performed, and may otherwise decrease the rate of wear on the region. At 445, after performing the memory management operation, the memory system may decrement the counter. For example, the memory system may decrement the counter by a predetermined or preconfigured value, or by a value otherwise specified by the host system (e.g., in accordance with a RAADEC per memory management command). In such cases, after performing the memory management operation and decrementing the counter, the memory system may return to the standby or idle state.

At 450, the memory system may identify a transition in power states. For example, the memory system may receive a command from the host system to transition from a first power state to a second power state. In other examples, the memory system may transition in power states based on an amount of elapsed time during which the memory system is idle (e.g., operating in standby mode).

At 455, the memory system may store the value of the counter. For example, the memory system may store the value of the counter to the first non-volatile memory by writing (e.g., rewriting, overwriting) the value of the counter to the first non-volatile memory. Additionally or alternatively, the memory system may be configured to store the value of the counter to the first non-volatile memory based on one or more triggering events. For example, the memory system may be operable to store the value of the counter to the first non-volatile memory after accessing the region of the second non-volatile memory and after receiving a command to store the value of the counter to the first non-volatile memory from the host system.

At 460, after storing the value of the counter, the memory system may transition to the second power state. As described with reference to FIG. 5, the memory system may similarly operate in accordance with the counter (e.g., the stored value) during the subsequent power cycle, where the value of the counter may be the same as stored to the first non-volatile memory (e.g., at 455). By storing the value of the counter before transitioning to the second power state, the memory system may maintain a continuous scheme to mitigate row hammering and the associated effects across power cycles.

Figure 5:
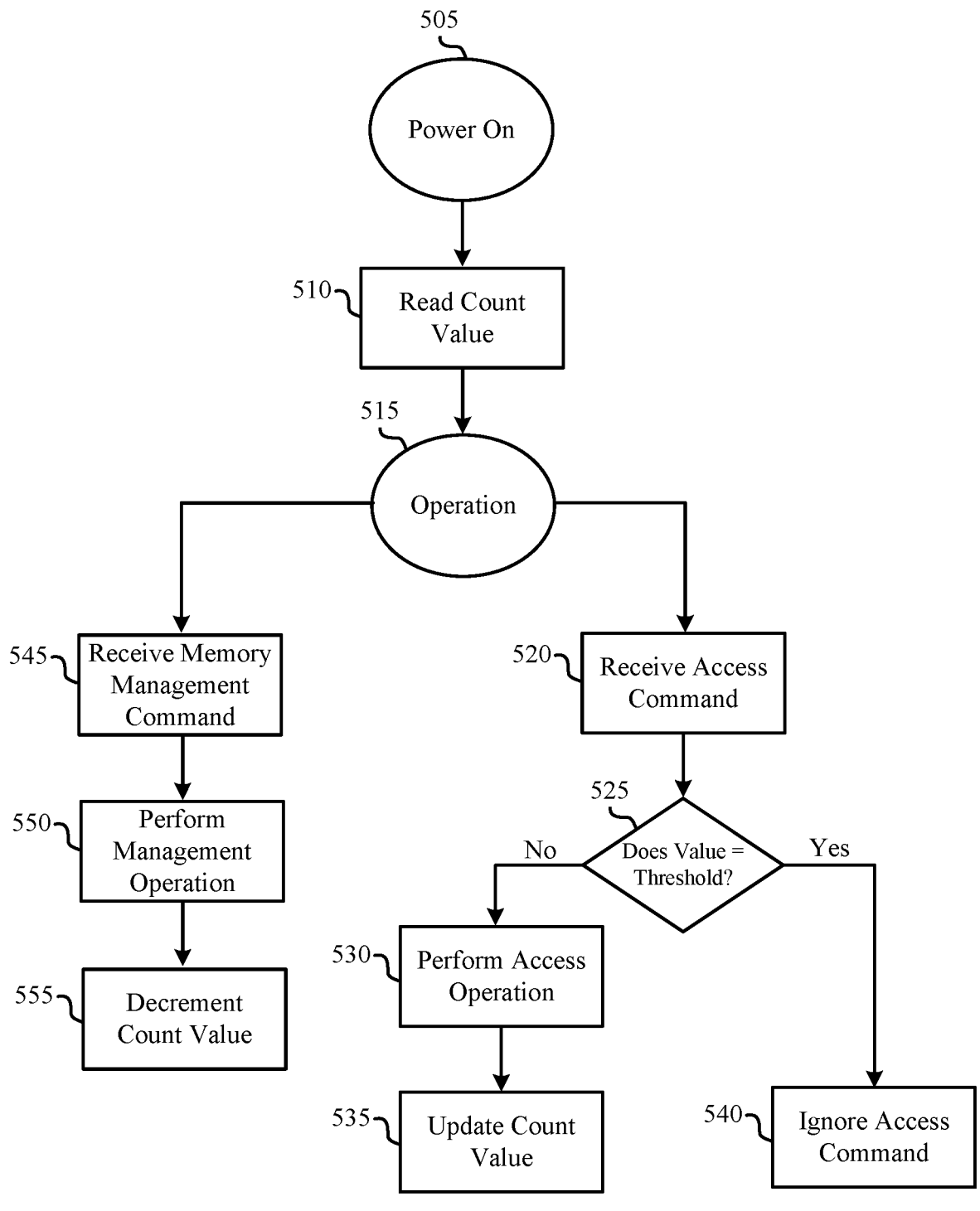
FIG. 5 illustrates an example of a process flow diagram that supports memory row-hammer mitigation in accordance with examples as disclosed herein.

FIG. 5 illustrates an example of a process flow diagram 500 that supports memory row-hammer mitigation in accordance with examples as disclosed herein. Aspects of the process flow diagram 500 may be implemented by a memory system described with reference to FIGS. 1 through 3. The memory system may be an example of the memory system 310 as described with reference to FIG. 3, and may include a first non-volatile memory and a second non-volatile memory. The process flow diagram 500 may depict a process for implementing a scheme to mitigate row hammering that is continuous across power cycles, where process flow diagram 500 may illustrate the operation of a memory system after transitioning power states By utilizing such a scheme that is continuous across power cycles, the memory system may have a prolonged useful life and improved overall performance.

In some cases, one or more aspects of the process flow diagram 500 may be implemented by a controller (e.g., among other components), of the memory system. Additionally or alternatively, aspects of the process flow diagram 500 may be implemented as instructions stored in the memory system, or by circuitry of the memory system. For example, the instructions, if executed by a controller, may cause the memory system to perform one or more of the operations of the process flow diagram 500. Alternative examples of the process flow diagram 500 may be implemented in which some operations are performed in a different order than described, or not performed at all. In some cases, operations may include features not mentioned below, or additional operations may be added.

At 505, the memory system may transition to a first power state. For example, the memory system may transition from a second power state (e.g., an 'OFF' state, a low power state, a hibernate state) to the first power state (e.g., an 'ON' state), where the first power state may be higher than the second power state. In such examples, by transitioning power states, the memory system may initiate a power cycle (e.g., a second power cycle following the power cycle described with reference to FIG. 4).

At 510, the memory system may read the value of the counter stored to the first non-volatile memory. In such examples, the memory system may implement a same addressing scheme as used in the previous access cycle. By maintaining counter continuity across power cycles, a malicious actor may not be able, or may otherwise be less likely, to hammer one or more target rows of the memory system. In some cases, the memory system may continue to store (e.g., maintain) the value of the counter at the first non-volatile memory. Additionally or alternatively, the memory system may maintain the counter at one or more other locations in the memory system (e.g., in the second non-volatile memory, in a cache included in a memory controller) during the current power cycle.

At 515, the memory system may perform one or more operations, and may be referred to as being in a standby or idle state with respect to receiving commands (e.g., access commands, memory management commands) from a host system. In such examples, the memory system may operate in the standby or idle state until the memory system receives a command from the host system.

At 520, the memory system may receive a command from a host system to access the region of the second non-volatile memory associated with the counter. In some cases, upon receiving the access command, the memory system may perform or refrain from performing an access operation as described herein. Additionally or alternatively, the memory system may receive a plurality of access commands (e.g., associated with the same region, associated with one or more different regions) and may or may not perform an access operation in accordance with each of the access commands.

At 525, the memory system may determine if the counter value satisfies a threshold value (e.g., a threshold quantity of access operations, RAAMMT). For example, the memory system may read the value of the counter from either the first non-volatile memory, the second non-volatile memory, or from various other locations of the memory system, and may determine if the value of the counter satisfies the threshold value.

At 530, if the value of the counter does not satisfy the threshold value (e.g., is less than the threshold value), the memory system may perform an access operation on the region of the second non-volatile memory associated with the access command. For example, the memory system may access (e.g., read data from, write data to) the region of the second non-volatile memory in accordance with the access command received at 520.

At 535, in response to performing the access operation, the memory system may update (e.g., increment, increase) the counter. The memory system may update the counter for each access operation performed on the region. After updating the counter, the memory system may return to a standby or idle state.

At 540, if the counter value satisfies (e.g., is greater than or equal to) the threshold value, the memory system may ignore or otherwise not process the access command. For example, the memory system may refrain from accessing the region of the second non-volatile memory, and thus may not update the counter. In some examples, the memory system may communicate one or more indications to the host system that the access operation was not performed. After ignoring or otherwise not processing the access command, the memory system may return to standby mode at 515.

At 545, the memory system may receive a command (e.g., a memory management command) from the host system to perform a memory management operation on the region of the second non-volatile memory. At 550, in response to receiving the memory management command, the memory system may perform one or more memory management operations on the region of the second non-volatile memory. By performing a memory management operation, the memory system may reduce the effects caused by the repeated access operations without a refresh operation being performed, and may otherwise decrease the rate of wear on the region. At 555, after performing the refresh operation, the memory system may decrement the counter. For example, the memory system may decrement the counter by a predetermined or preconfigured value, or by a value otherwise specified by the host system (e.g., in accordance with a RAADEC per memory management command). In such cases, after performing the memory management operation and decrementing the counter, the memory system may return to the standby or idle state.

By maintaining a continuous count of access operations performed on the region of the second non-volatile memory, the memory system may mitigate the likelihood of row-hammering events caused by a malicious actor. For example, the malicious actor may be unaware of the value of the counter across power cycles because it is not reset to a known or otherwise determinable value and, as such, the malicious actor will not be able to exploit the count value to hammer target rows of the second non-volatile memory. In general, by implementing such techniques, the memory system may have a prolonged useful life and improved overall performance.

Figure 6:
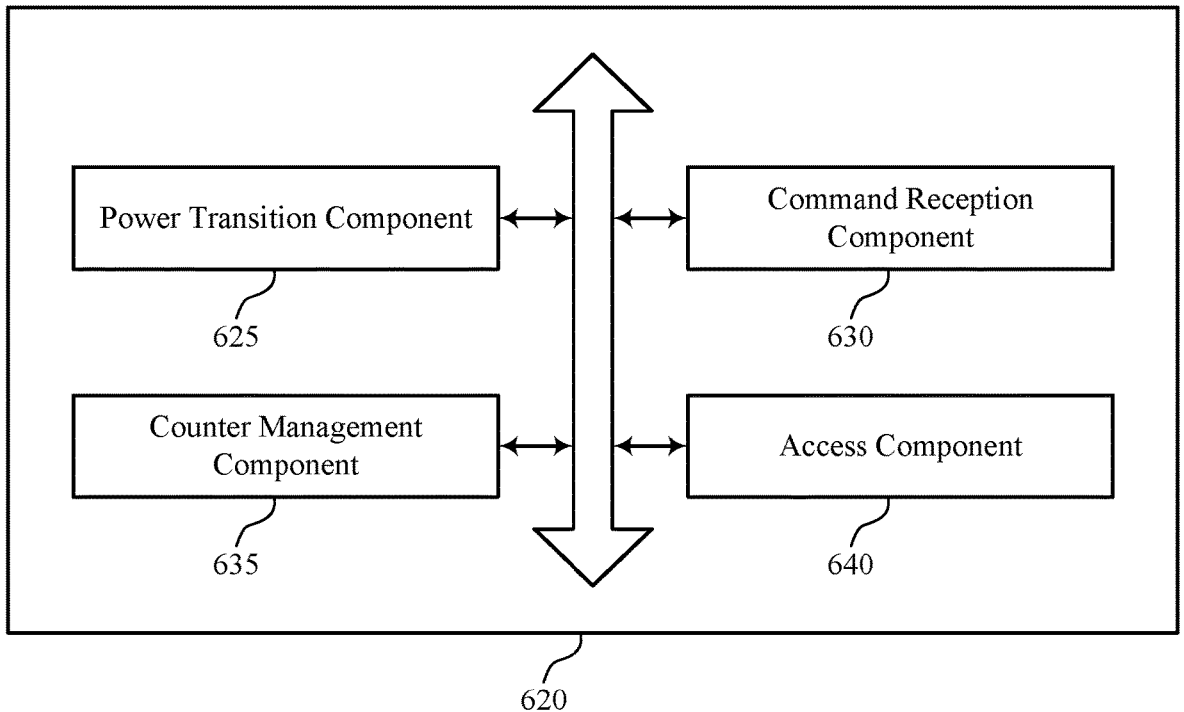
FIGS. 6 and 7 show block diagrams of a memory system that supports memory row-hammer mitigation in accordance with examples as disclosed herein.

FIG. 6 shows a block diagram 600 of a memory system 620 that supports memory row-hammer mitigation in accordance with examples as disclosed herein. The memory system 620 may be an example of aspects of a memory system as described with reference to FIGS. 1 through 5. The memory system 620, or various components thereof, may be an example of means for performing various aspects of memory row-hammer mitigation as described herein. For example, the memory system 620 may include a power transition component 625, a command reception component 630, a counter management component 635, an access component 640, or any combination thereof. Each of these components may communicate, directly or indirectly, with one another (e.g., via one or more buses).

The power transition component 625 may be configured as or otherwise support a means for transitioning, by a memory device including a first non-volatile memory and a second non-volatile memory, from a first power state to a second power state. The command reception component 630 may be configured as or otherwise support a means for receiving a command to access a region of the second non-volatile memory based at least in part on transitioning from the first power state to the second power state. The counter management component 635 may be configured as or otherwise support a means for reading a value of a counter stored to the first non-volatile memory based at least in part on receiving the command to access the region of the second non-volatile memory, where the value of the counter is associated with a quantity of access operations performed on the second non-volatile memory before transitioning from the first power state to the second power state. The access component 640 may be configured as or otherwise support a means for refraining from accessing the region of the second non-volatile memory for a duration based at least in part on the value of the counter stored to the first non-volatile memory satisfying a threshold value.

In some examples, the command reception component 630 may be configured as or otherwise support a means for receiving a second command to perform a memory management on at least the region of the second non-volatile memory while operating in the second power state. In some examples, the counter management component 635 may be configured as or otherwise support a means for decrementing the value of the counter based at least in part on receiving the second command to perform a refresh operation.

In some examples, the command reception component 630 may be configured as or otherwise support a means for receiving a third command to access the region of the second non-volatile memory based at least in part on decrementing the value of the counter. In some examples, the counter management component 635 may be configured as or otherwise support a means for reading the value of the counter stored to the first non-volatile memory based at least in part on receiving the third command to access the region of the second non-volatile memory. In some examples, the access component 640 may be configured as or otherwise support a means for accessing the region of the second non-volatile memory based at least in part on the value of the counter not satisfying the threshold value.

In some examples, the counter management component 635 may be configured as or otherwise support a means for determining that the value of the counter does not satisfy the threshold value based at least in part on reading the value of the counter, where accessing the region of the second non-volatile memory is based at least in part on determining that the value of the counter does not satisfy the threshold value.

In some examples, the counter management component 635 may be configured as or otherwise support a means for updating the value of the counter based at least in part on accessing the region of the second non-volatile memory.

In some examples, the command reception component 630 may be configured as or otherwise support a means for receiving a fourth command to transition from the second power state to the first power state. In some examples, the counter management component 635 may be configured as or otherwise support a means for storing the value of the counter to the first non-volatile memory based at least in part on receiving the command to transition from the second power state to the first power state.

In some examples, the counter management component 635 may be configured as or otherwise support a means for determining that the value of the counter satisfies the threshold value based at least in part on reading the value of the counter, where refraining from accessing the region of the second non-volatile memory is based at least in part on determining that the value of the counter satisfies the threshold value.

In some examples, the first non-volatile memory includes a register for storing the value of the counter.

In some examples, the second power state includes a higher power state than the first power state.

Figure 7:
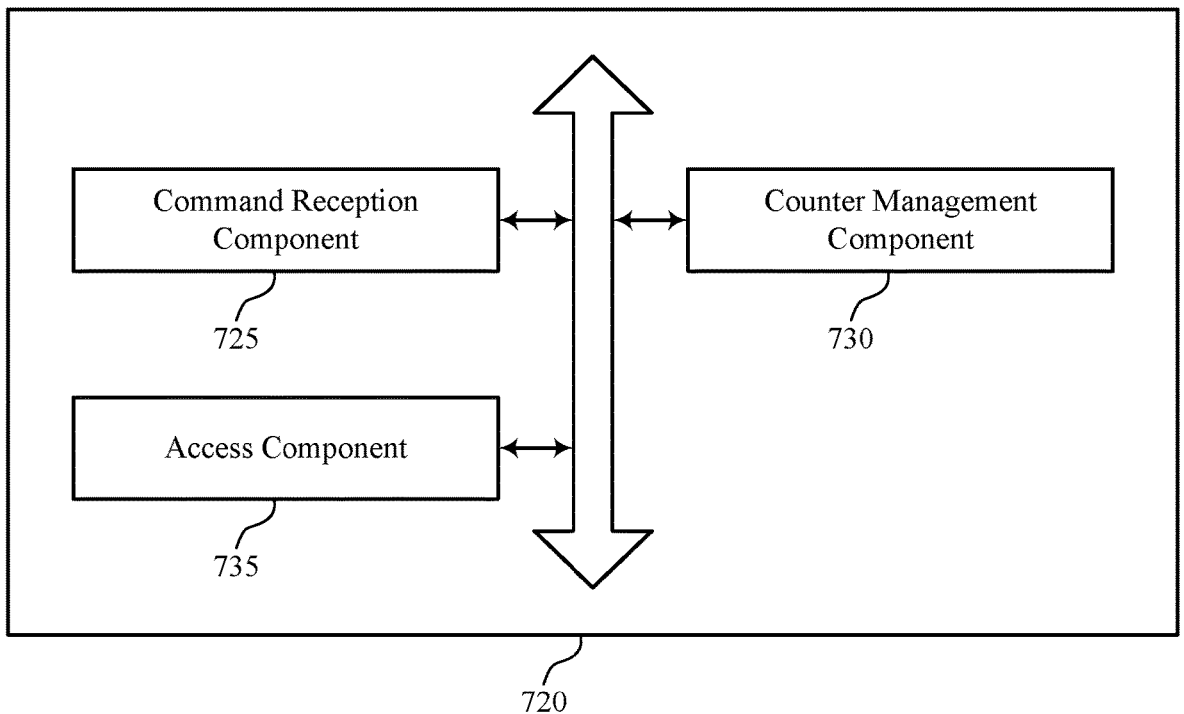

FIG. 7 shows a block diagram 700 of a memory system 720 that supports memory row-hammer mitigation in accordance with examples as disclosed herein. The memory system 720 may be an example of aspects of a memory system as described with reference to FIGS. 1 through 5. The memory system 720, or various components thereof, may be an example of means for performing various aspects of memory row-hammer mitigation as described herein. For example, the memory system 720 may include a command reception component 725, a counter management component 730, an access component 735, or any combination thereof. Each of these components may communicate, directly or indirectly, with one another (e.g., via one or more buses).

The command reception component 725 may be configured as or otherwise support a means for receiving, at a memory device including a first non-volatile memory and a second non-volatile memory, a command to access a region of the second non-volatile memory. The counter management component 730 may be configured as or otherwise support a means for updating a value of a counter associated with the region of the second non-volatile memory based at least in part on receiving the command to access the region of the second non-volatile memory, where the value of the counter is associated with a quantity of access operations performed on the region of the second non-volatile memory before transitioning from a first power state to a second power state. In some examples, the command reception component 725 may be configured as or otherwise support a means for receiving a command to transition from the first power state to the second power state based at least in part on updating the value of the counter associated with the memory device. In some examples, the counter management component 730 may be configured as or otherwise support a means for storing the value of the counter to the first non-volatile memory based at least in part on receiving the command to transition from the first power state to the second power state, the value stored to the first non-volatile memory indicating whether to perform an access operation on the region of the second non-volatile memory upon transitioning from the second power state to the first power state.

In some examples, the command reception component 725 may be configured as or otherwise support a means for receiving a second command to transition from the second power state to the first power state. In some examples, the command reception component 725 may be configured as or otherwise support a means for receiving a third command to access the region of the second non-volatile memory based at least in part on transitioning from the second power state to the first power state. In some examples, the counter management component 730 may be configured as or otherwise support a means for reading the value of the counter stored to the first non-volatile memory based at least in part on receiving the third command to access the region of the second non-volatile memory. In some examples, the access component 735 may be configured as or otherwise support a means for refraining from accessing the region of the second non-volatile memory based at least in part on the value of the counter satisfying a threshold value.

In some examples, the command reception component 725 may be configured as or otherwise support a means for receiving a fourth command to perform a memory management operation while operating in the first power state. In some examples, the counter management component 730 may be configured as or otherwise support a means for decrementing the value of the counter based at least in part on receiving the fourth command to perform the memory management operation.

In some examples, the command reception component 725 may be configured as or otherwise support a means for receiving a fifth command to access the region of the second non-volatile memory based at least in part on decrementing the value of the counter. In some examples, the counter management component 730 may be configured as or otherwise support a means for reading the value of the counter stored to the first non-volatile memory based at least in part on receiving the fifth command to access the region of the second non-volatile memory. In some examples, the access component 735 may be configured as or otherwise support a means for accessing the region of the second non-volatile memory based at least in part on the value of the counter not satisfying the threshold value.

In some examples, the counter management component 730 may be configured as or otherwise support a means for determining that the value of the counter does not satisfy the threshold value based at least in part on reading the value of the counter from the first non-volatile memory, where accessing the region of the second non-volatile memory is based at least in part on determining that the value of the counter does not satisfy the threshold value.

In some examples, the counter management component 730 may be configured as or otherwise support a means for determining that the value of the counter does not satisfy a threshold value based at least in part on receiving the command to access the region of the second non-volatile memory. In some examples, the access component 735 may be configured as or otherwise support a means for accessing the region of the second non-volatile memory based at least in part on determining that the value of the counter does not satisfy the threshold value, where updating the value of the counter is based at least in part on determining that the value of the counter does not satisfy the threshold value.

In some examples, the first non-volatile memory includes a register for storing the value of the counter.

In some examples, the first power state includes a higher power state than the second power state.

Figure 8:
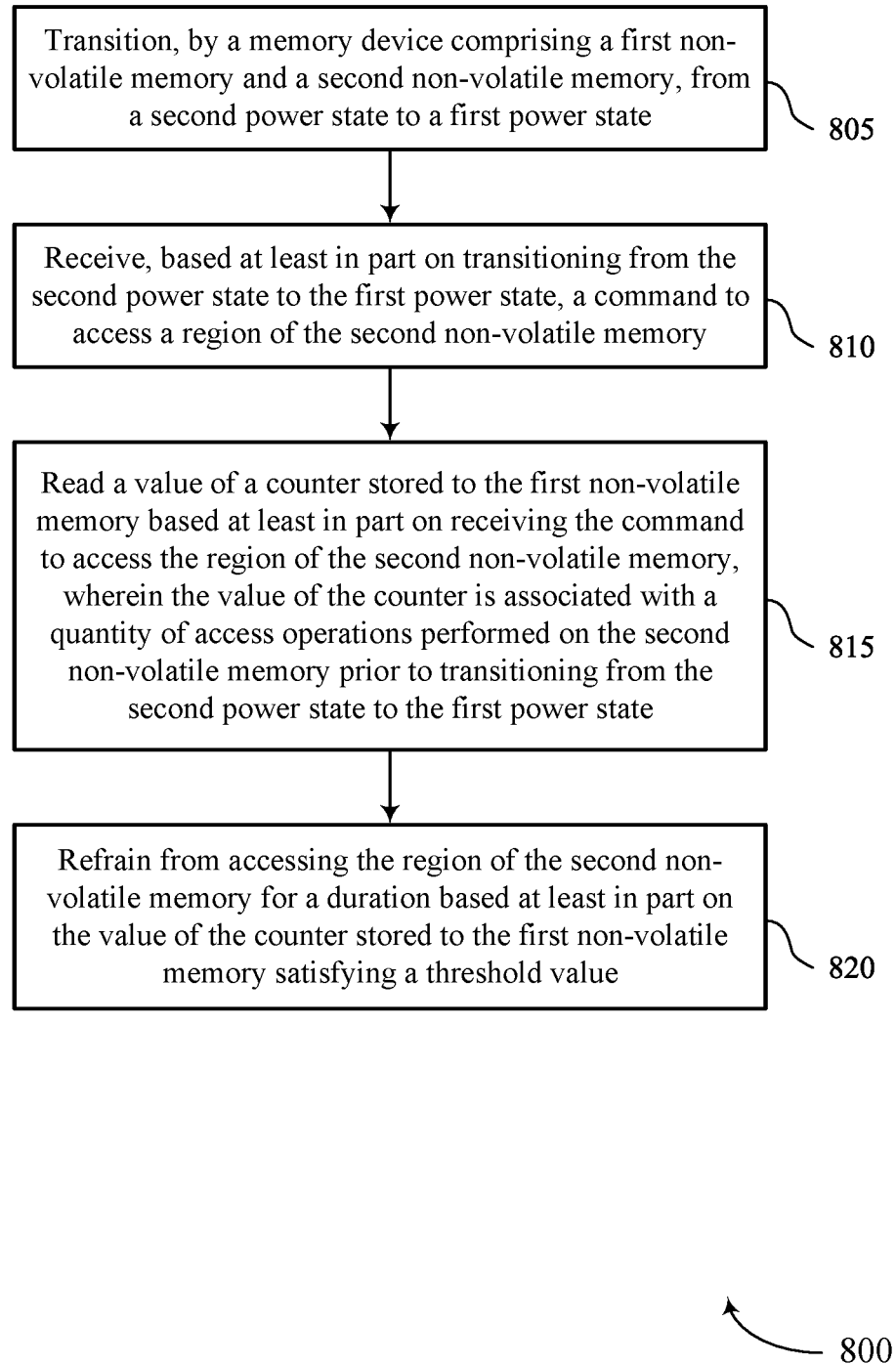
FIGS. 8 and 9 show flowcharts illustrating a method or methods that support memory row-hammer mitigation in accordance with examples as disclosed herein.

FIG. 8 shows a flowchart illustrating a method 800 that supports memory row-hammer mitigation in accordance with examples as disclosed herein. The operations of method 800 may be implemented by a memory system or its components as described herein. For example, the operations of method 800 may be performed by a memory system as described with reference to FIGS. 1 through 6. In some examples, a memory system may execute a set of instructions to control the functional elements of the device to perform the described functions. Additionally, or alternatively, the memory system may perform aspects of the described functions using special-purpose hardware.

At 805, the method may include transitioning, by a memory device including a first non-volatile memory and a second non-volatile memory, from a first power state to a second power state. The operations of 805 may be performed in accordance with examples as disclosed herein. In some examples, aspects of the operations of 805 may be performed by a power transition component 625 as described with reference to FIG. 6.

At 810, the method may include receiving a command to access a region of the second non-volatile memory based at least in part on transitioning from the first power state to the second power state. The operations of 810 may be performed in accordance with examples as disclosed herein. In some examples, aspects of the operations of 810 may be performed by a command reception component 630 as described with reference to FIG. 6.

At 815, the method may include reading a value of a counter stored to the first non-volatile memory based at least in part on receiving the command to access the region of the second non-volatile memory, where the value of the counter is associated with a quantity of access operations performed on the second non-volatile memory before transitioning from the first power state to the second power state. The operations of 815 may be performed in accordance with examples as disclosed herein. In some examples, aspects of the operations of 815 may be performed by a counter management component 635 as described with reference to FIG. 6.

At 820, the method may include refraining from accessing the region of the second non-volatile memory for a duration based at least in part on the value of the counter stored to the first non-volatile memory satisfying a threshold value. The operations of 820 may be performed in accordance with examples as disclosed herein. In some examples, aspects of the operations of 820 may be performed by an access component 640 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for transitioning, by a memory device including a first non-volatile memory and a second non-volatile memory, from a first power state to a second power state; receiving a command to access a region of the second non-volatile memory based at least in part on transitioning from the first power state to the second power state; reading a value of a counter stored to the first non-volatile memory based at least in part on receiving the command to access the region of the second non-volatile memory, where the value of the counter is associated with a quantity of access operations performed on the second non-volatile memory before transitioning from the first power state to the second power state; and refraining from accessing the region of the second non-volatile memory for a duration based at least in part on the value of the counter stored to the first non-volatile memory satisfying a threshold value.

Aspect 2: The method, apparatus, or non-transitory computer-readable medium of aspect 1, further including operations, features, circuitry, logic, means, or instructions, or any combination thereof for receiving a second command to perform a memory management operation on at least the region of the second non-volatile memory while operating in the second power state and decrementing the value of the counter based at least in part on receiving the second command to perform the memory management operation.

Aspect 3: The method, apparatus, or non-transitory computer-readable medium of aspect 2, further including operations, features, circuitry, logic, means, or instructions, or any combination thereof for receiving a third command to access the region of the second non-volatile memory based at least in part on decrementing the value of the counter; reading the value of the counter stored to the first non-volatile memory based at least in part on receiving the third command to access the region of the second non-volatile memory; and accessing the region of the second non-volatile memory based at least in part on the value of the counter not satisfying the threshold value.

Aspect 4: The method, apparatus, or non-transitory computer-readable medium of aspect 3, further including operations, features, circuitry, logic, means, or instructions, or any combination thereof for determining that the value of the counter does not satisfy the threshold value based at least in part on reading the value of the counter, where accessing the region of the second non-volatile memory is based at least in part on determining that the value of the counter does not satisfy the threshold value.

Aspect 5: The method, apparatus, or non-transitory computer-readable medium of any of aspects 3 through 4, further including operations, features, circuitry, logic, means, or instructions, or any combination thereof for updating the value of the counter based at least in part on accessing the region of the second non-volatile memory.

Aspect 6: The method, apparatus, or non-transitory computer-readable medium of any of aspects 1 through 5, further including operations, features, circuitry, logic, means, or instructions, or any combination thereof for receiving a fourth command to transition from the second power state to the first power state and storing the value of the counter to the first non-volatile memory based at least in part on receiving the command to transition from the second power state to the first power state.

Aspect 7: The method, apparatus, or non-transitory computer-readable medium of any of aspects 1 through 6, further including operations, features, circuitry, logic, means, or instructions, or any combination thereof for determining that the value of the counter satisfies the threshold value based at least in part on reading the value of the counter, where refraining from accessing the region of the second non-volatile memory is based at least in part on determining that the value of the counter satisfies the threshold value.

Aspect 8: The method, apparatus, or non-transitory computer-readable medium of any of aspects 1 through 7, where the first non-volatile memory includes a register for storing the value of the counter.

Aspect 9: The method, apparatus, or non-transitory computer-readable medium of any of aspects 1 through 8, where the second power state includes a higher power state than the first power state.

Figure 9:
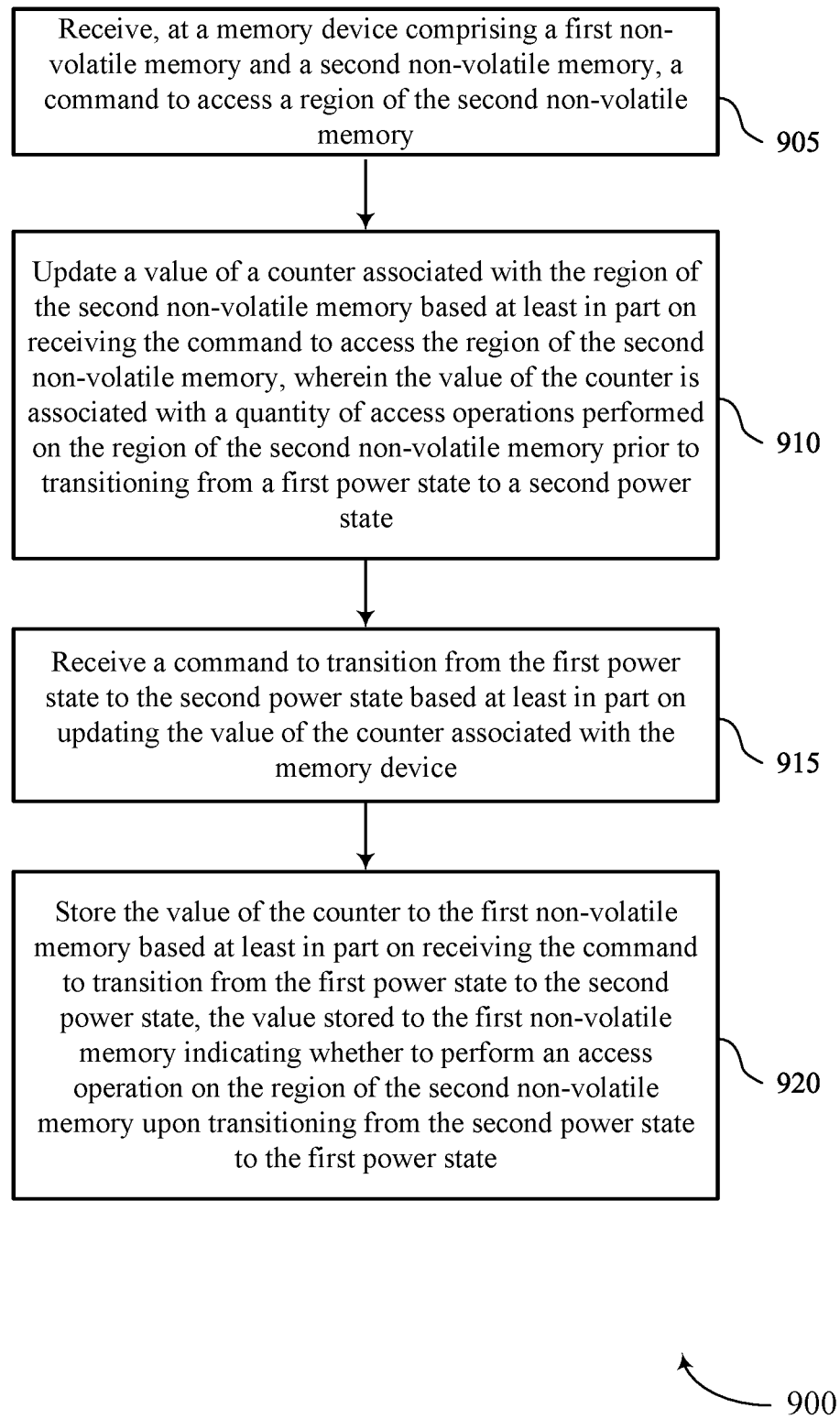

FIG. 9 shows a flowchart illustrating a method 900 that supports memory row-hammer mitigation in accordance with examples as disclosed herein. The operations of method 900 may be implemented by a memory system or its components as described herein. For example, the operations of method 900 may be performed by a memory system as described with reference to FIGS. 1 through 5 and 7. In some examples, a memory system may execute a set of instructions to control the functional elements of the device to perform the described functions. Additionally, or alternatively, the memory system may perform aspects of the described functions using special-purpose hardware.

At 905, the method may include receiving, at a memory device including a first non-volatile memory and a second non-volatile memory, a command to access a region of the second non-volatile memory. The operations of 905 may be performed in accordance with examples as disclosed herein. In some examples, aspects of the operations of 905 may be performed by a command reception component 725 as described with reference to FIG. 7.

At 910, the method may include updating a value of a counter associated with the region of the second non-volatile memory based at least in part on receiving the command to access the region of the second non-volatile memory, where the value of the counter is associated with a quantity of access operations performed on the region of the second non-volatile memory before transitioning from a first power state to a second power state. The operations of 910 may be performed in accordance with examples as disclosed herein. In some examples, aspects of the operations of 910 may be performed by a counter management component 730 as described with reference to FIG. 7.

At 915, the method may include receiving a command to transition from the first power state to the second power state based at least in part on updating the value of the counter associated with the memory device. The operations of 915 may be performed in accordance with examples as disclosed herein. In some examples, aspects of the operations of 915 may be performed by a command reception component 725 as described with reference to FIG. 7.

At 920, the method may include storing the value of the counter to the first non-volatile memory based at least in part on receiving the command to transition from the first power state to the second power state, the value stored to the first non-volatile memory indicating whether to perform an access operation on the region of the second non-volatile memory upon transitioning from the second power state to the first power state. The operations of 920 may be performed in accordance with examples as disclosed herein. In some examples, aspects of the operations of 920 may be performed by a counter management component 730 as described with reference to FIG. 7.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 10: A method, apparatus, or non-transitory computer-readable medium including operations, features, circuitry, logic, means, or instructions, or any combination thereof for receiving, at a memory device including a first non-volatile memory and a second non-volatile memory, a command to access a region of the second non-volatile memory; updating a value of a counter associated with the region of the second non-volatile memory based at least in part on receiving the command to access the region of the second non-volatile memory, where the value of the counter is associated with a quantity of access operations performed on the region of the second non-volatile memory before transitioning from a first power state to a second power state; receiving a command to transition from the first power state to the second power state based at least in part on updating the value of the counter associated with the memory device; and storing the value of the counter to the first non-volatile memory based at least in part on receiving the command to transition from the first power state to the second power state, the value stored to the first non-volatile memory indicating whether to perform an access operation on the region of the second non-volatile memory upon transitioning from the second power state to the first power state.

Aspect 11: The method, apparatus, or non-transitory computer-readable medium of aspect 10, further including operations, features, circuitry, logic, means, or instructions, or any combination thereof for receiving a second command to transition from the second power state to the first power state; receiving a third command to access the region of the second non-volatile memory based at least in part on transitioning from the second power state to the first power state; reading the value of the counter stored to the first non-volatile memory based at least in part on receiving the third command to access the region of the second non-volatile memory; and refraining from accessing the region of the second non-volatile memory based at least in part on the value of the counter satisfying a threshold value.

Aspect 12: The method, apparatus, or non-transitory computer-readable medium of aspect 11, further including operations, features, circuitry, logic, means, or instructions, or any combination thereof for receiving a fourth command to perform a memory management operation while operating in the first power state and decrementing the value of the counter based at least in part on receiving the fourth command to perform the memory management operation.

Aspect 13: The method, apparatus, or non-transitory computer-readable medium of aspect 12, further including operations, features, circuitry, logic, means, or instructions, or any combination thereof for receiving a fifth command to access the region of the second non-volatile memory based at least in part on decrementing the value of the counter; reading the value of the counter stored to the first non-volatile memory based at least in part on receiving the fifth command to access the region of the second non-volatile memory; and accessing the region of the second non-volatile memory based at least in part on the value of the counter not satisfying the threshold value.

Aspect 14: The method, apparatus, or non-transitory computer-readable medium of aspect 13, further including operations, features, circuitry, logic, means, or instructions, or any combination thereof for determining that the value of the counter does not satisfy the threshold value based at least in part on reading the value of the counter from the first non-volatile memory, where accessing the region of the second non-volatile memory is based at least in part on determining that the value of the counter does not satisfy the threshold value.

Aspect 15: The method, apparatus, or non-transitory computer-readable medium of any of aspects 10 through 14, further including operations, features, circuitry, logic, means, or instructions, or any combination thereof for determining that the value of the counter does not satisfy a threshold value based at least in part on receiving the command to access the region of the second non-volatile memory and accessing the region of the second non-volatile memory based at least in part on determining that the value of the counter does not satisfy the threshold value, where updating the value of the counter is based at least in part on determining that the value of the counter does not satisfy the threshold value.

Aspect 16: The method, apparatus, or non-transitory computer-readable medium of any of aspects 10 through 15, where the first non-volatile memory includes a register for storing the value of the counter.

Aspect 17: The method, apparatus, or non-transitory computer-readable medium of any of aspects 10 through 16, where the first power state includes a higher power state than the second power state.

It should be noted that the methods described herein are possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
  transitioning, by a memory device comprising a first non-volatile memory and a second non-volatile memory, from a second power state to a first power state;
  receiving, based at least in part on transitioning from the second power state to the first power state, a command to access a region of the second non-volatile memory;
  reading a value of a counter stored to the first non-volatile memory based at least in part on receiving the command to access the region of the second non-volatile memory, wherein the value of the counter is associated with a quantity of access operations performed on the second non-volatile memory before transitioning from the second power state to the first power state; and
  refraining from accessing the region of the second non-volatile memory based at least in part on the value of the counter stored to the first non-volatile memory satisfying a threshold value.

2. The method of claim 1, further comprising:
  receiving a second command to perform a memory management operation on at least the region of the second non-volatile memory while operating in the first power state; and
  decrementing the value of the counter based at least in part on receiving the second command to perform the memory management operation.

3. The method of claim 2, further comprising:
  receiving, based at least in part on decrementing the value of the counter, a third command to access the region of the second non-volatile memory;
  reading the value of the counter stored to the first non-volatile memory based at least in part on receiving the third command to access the region of the second non-volatile memory; and
  accessing the region of the second non-volatile memory based at least in part on the value of the counter not satisfying the threshold value.

4. The method of claim 3, further comprising:
  determining that the value of the counter does not satisfy the threshold value based at least in part on reading the value of the counter, wherein the accessing the region of the second non-volatile memory is based at least in part on determining that the value of the counter does not satisfy the threshold value.

5. The method of claim 3, further comprising:
  updating the value of the counter based at least in part on accessing the region of the second non-volatile memory.

6. The method of claim 1, further comprising:
  receiving a fourth command to transition from the first power state to the second power state; and
  storing the value of the counter to the first non-volatile memory based at least in part on receiving the command to transition from the first power state to the second power state.

7. The method of claim 1, further comprising:
  determining that the value of the counter satisfies the threshold value based at least in part on reading the value of the counter, wherein the refraining from accessing the region of the second non-volatile memory is based at least in part on determining that the value of the counter satisfies the threshold value.

8. The method of claim 1, wherein the first non-volatile memory comprises a register for storing the value of the counter.

9. The method of claim 1, wherein the first power state comprises a higher power state than the second power state.

10. A method, comprising:
  receiving, at a memory device comprising a first non-volatile memory and a second non-volatile memory, a command to access a region of the second non-volatile memory;
  updating a value of a counter associated with the region of the second non-volatile memory based at least in part on receiving the command to access the region of the second non-volatile memory, wherein the value of the counter is associated with a quantity of access operations performed on the region of the second non-volatile memory before transitioning from a first power state to a second power state;

receiving, after updating the value of the counter associated with the memory device, a command to transition from the first power state to the second power state; and storing the value of the counter to the first non-volatile memory based at least in part on receiving the command to transition from the first power state to the second power state, the value stored to the first non-volatile memory indicating whether to perform an access operation on the region of the second non-volatile memory upon transitioning from the second power state to the first power state.

11. The method of claim 10, further comprising:
receiving a second command to transition from the second power state to the first power state;
receiving a third command to access the region of the second non-volatile memory based at least in part on transitioning from the second power state to the first power state;
reading the value of the counter stored to the first non-volatile memory based at least in part on receiving the third command to access the region of the second non-volatile memory; and
refraining from accessing the region of the second non-volatile memory based at least in part on the value of the counter satisfying a threshold value.

12. The method of claim 11, further comprising:
receiving a fourth command to perform a memory management operation while operating in the first power state; and
decrementing, based at least in part on receiving the fourth command to perform the memory management operation, the value of the counter to obtain a second value, wherein the second value is a decremented value.

13. The method of claim 12, further comprising:
receiving, based at least in part on obtaining the second value, a fifth command to access the region of the second non-volatile memory;
reading the second value of the counter stored to the first non-volatile memory based at least in part on receiving the fifth command to access the region of the second non-volatile memory; and
accessing the region of the second non-volatile memory based at least in part on the second value of the counter not satisfying the threshold value.

14. The method of claim 13, further comprising:
determining that the second value of the counter does not satisfy the threshold value based at least in part on reading the second value of the counter from the first non-volatile memory, wherein the accessing the region of the second non-volatile memory is based at least in part on determining that the second value of the counter does not satisfy the threshold value.

15. The method of claim 10, further comprising:
determining that the value of the counter does not satisfy a threshold value based at least in part on receiving the command to access the region of the second non-volatile memory; and
accessing the region of the second non-volatile memory based at least in part on determining that the value of the counter does not satisfy the threshold value, wherein the updating the value of the counter is based at least in part on determining that the value of the counter does not satisfy the threshold value.

16. The method of claim 10, wherein the first non-volatile memory comprises a register for storing the value of the counter.

17. The method of claim 10, wherein the first power state comprises a higher power state than the second power state.

18. An apparatus comprising:
a memory device; and
a controller coupled with the memory device, the controller configured to cause the apparatus to:
transition, by the memory device comprising a first non-volatile memory and a second non-volatile memory, from a second power state to a first power state;
receiving, based at least in part on transitioning from the second power state to the first power state, a command to access a region of the second non-volatile memory;
reading a value of a counter stored to the first non-volatile memory based at least in part on receiving the command to access the region of the second non-volatile memory, wherein the value of the counter is associated with a quantity of access operations performed on the second non-volatile memory before transitioning from the second power state to the first power state; and
refraining from accessing the region of the second non-volatile memory based at least in part on the value of the counter stored to the first non-volatile memory satisfying a threshold value.

19. The apparatus of claim 18, wherein the controller is further configured to cause the apparatus to:
receive a second command to perform a memory management operation on at least the region of the second non-volatile memory while operating in the first power state; and
decrement the value of the counter based at least in part on receiving the second command to perform the memory management operation.

20. The apparatus of claim 19, wherein the controller is further configured to cause the apparatus to:
receive, based at least in part on decrementing the value of the counter, a third command to access the region of the second non-volatile memory;
read the value of the counter stored to the first non-volatile memory based at least in part on receiving the third command to access the region of the second non-volatile memory; and
access the region of the second non-volatile memory based at least in part on the value of the counter not satisfying the threshold value.

21. The apparatus of claim 20, wherein the controller is further configured to cause the apparatus to:
determine that the value of the counter does not satisfy the threshold value based at least in part on reading the value of the counter, wherein the accessing the region of the second non-volatile memory is based at least in part on determining that the value of the counter does not satisfy the threshold value.

22. An apparatus, comprising:
a memory device; and
a controller coupled with the memory device, the controller configured to cause the apparatus to:
receive, at the memory device comprising a first non-volatile memory and a second non-volatile memory, a command to access a region of the second non-volatile memory;

update a value of a counter associated with the region of the second non-volatile memory based at least in part on receiving the command to access the region of the second non-volatile memory, wherein the value of the counter is associated with a quantity of access operations performed on the region of the second non-volatile memory before transitioning from a first power state to a second power state;

receive, after updating the value of the counter associated with the memory device, a command to transition from the first power state to the second power state; and store the value of the counter to the first non-volatile memory based at least in part on receiving the command to transition from the first power state to the second power state, the value stored to the first non-volatile memory indicating whether to perform an access operation on the region of the second non-volatile memory upon transitioning from the second power state to the first power state.

23. The apparatus of claim 22, wherein the controller is further configured to cause the apparatus to:

receive a second command to transition from the second power state to the first power state;

receive, based at least in part on transitioning from the second power state to the first power state, a third command to access the region of the second non-volatile memory;

read the value of the counter stored to the first non-volatile memory based at least in part on receiving the third command to access the region of the second non-volatile memory; and refrain from accessing the region of the second non-volatile memory based at least in part on the value of the counter satisfying a threshold value.

24. The apparatus of claim 23, wherein the controller is further configured to cause the apparatus to:

receive a fourth command to perform a memory management operation while operating in the first power state; and decrement, based at least in part on receiving the fourth command to perform the memory management operation, the value of the counter to obtain a second value, wherein the second value is a decremented value.

25. The apparatus of claim 24, wherein the controller is further configured to cause the apparatus to:

receive, based at least in part on obtaining the second value of the counter, a fifth command to access the region of the second non-volatile memory;

read the second value of the counter stored to the first non-volatile memory based at least in part on receiving the fifth command to access the region of the second non-volatile memory; and access the region of the second non-volatile memory based at least in part on the second value of the counter not satisfying the threshold value.

* * * * *